United States Patent
Lee et al.

(10) Patent No.: US 10,573,225 B2
(45) Date of Patent: Feb. 25, 2020

(54) GATE DRIVE CIRCUIT AND DISPLAY DEVICE USING THE SAME

(71) Applicant: LG DISPLAY CO., LTD., Seoul (KR)

(72) Inventors: Junghyun Lee, Paju-si (KR);
Taewoong Moon, Paju-si (KR);
Yeonkyung Kim, Daejeon (KR)

(73) Assignee: LG Display Co., Ltd., Seoul (KR)

( * ) Notice: Subject to any disclaimer, the term of this patent is extended or adjusted under 35 U.S.C. 154(b) by 158 days.

(21) Appl. No.: 15/720,869

(22) Filed: Sep. 29, 2017

(65) Prior Publication Data

US 2018/0096645 A1 Apr. 5, 2018

(30) Foreign Application Priority Data

Sep. 30, 2016 (KR) .......................... 10-2016-0127118

(51) Int. Cl.
| | | |
|---|---|---|
| *G11C 19/00* | (2006.01) | |
| *G09G 3/20* | (2006.01) | |
| *G11C 19/28* | (2006.01) | |
| *G09G 3/36* | (2006.01) | |

(52) U.S. Cl.
CPC ............ *G09G 3/2092* (2013.01); *G09G 3/20* (2013.01); *G09G 3/2085* (2013.01); *G09G 3/3677* (2013.01); *G09G 2300/0408* (2013.01); *G09G 2300/0426* (2013.01); *G09G 2300/08* (2013.01); *G09G 2310/0264* (2013.01); *G09G 2310/0267* (2013.01); *G09G 2310/0286* (2013.01); *G09G 2330/028* (2013.01); *G11C 19/28* (2013.01)

(58) Field of Classification Search
None
See application file for complete search history.

(56) References Cited

U.S. PATENT DOCUMENTS

| | | | |
|---|---|---|---|
| 2007/0001991 A1* | 1/2007 | Jang | G09G 3/3677 345/100 |
| 2007/0104307 A1* | 5/2007 | Kim | G11C 19/28 377/64 |
| 2008/0219401 A1* | 9/2008 | Tobita | G09G 3/3677 377/79 |
| 2009/0167668 A1* | 7/2009 | Kim | G09G 3/3677 345/100 |

(Continued)

FOREIGN PATENT DOCUMENTS

| | | |
|---|---|---|
| KR | 20130062127 A | 6/2013 |
| KR | 20160017390 A | 2/2016 |

*Primary Examiner* — Tuan T Lam
(74) *Attorney, Agent, or Firm* — Seed Intellectual Property Law Group LLP

(57) ABSTRACT

A gate drive circuit and a display device are provided. The gate drive circuit comprises: a first stage that outputs a first gate pulse at a first output terminal by increasing a voltage at the first output terminal when a first Q node is charged in response to receiving a first carry signal at a first start terminal, and decreasing the voltage at the first output terminal when a first QB node is charged; and a second stage that outputs a second gate pulse at a second output terminal and outputs a second carry signal at a third output terminal by increasing voltages at the second and third output terminals when a second Q node is charged in response to receiving the first carry signal at a second start terminal, and decreasing the voltages at the second and third output terminals when a second QB node is charged.

19 Claims, 12 Drawing Sheets

(56) References Cited

U.S. PATENT DOCUMENTS

| | | | | |
|---|---|---|---|---|
| 2010/0150302 A1* | 6/2010 | Tsai | ............... | G11C 19/28 377/79 |
| 2011/0002438 A1* | 1/2011 | Kim | ............... | G11C 19/28 377/67 |
| 2011/0157124 A1* | 6/2011 | Jung | ............... | G11C 19/28 345/211 |
| 2014/0010341 A1* | 1/2014 | Wu | ............... | G11C 19/00 377/78 |
| 2015/0116194 A1* | 4/2015 | Matsui | ............ | G09G 3/3266 345/100 |
| 2018/0151143 A1* | 5/2018 | Kim | ............... | G06F 3/0418 |

* cited by examiner

FIG. 10
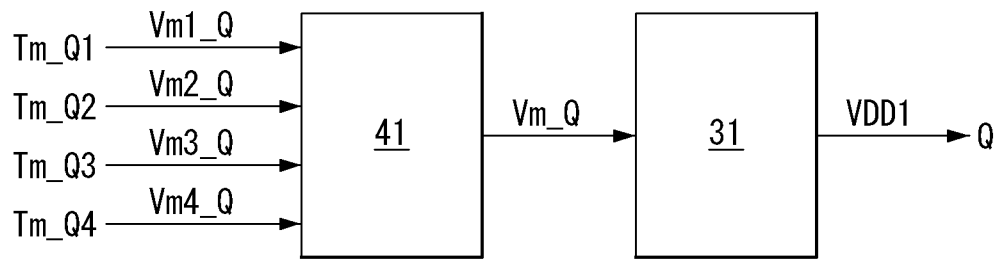
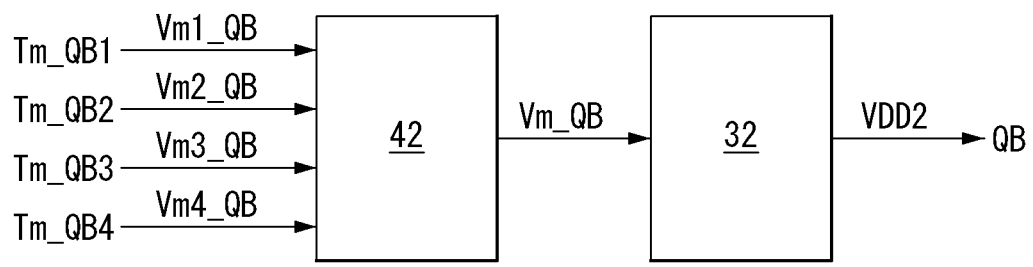
FIG. 11
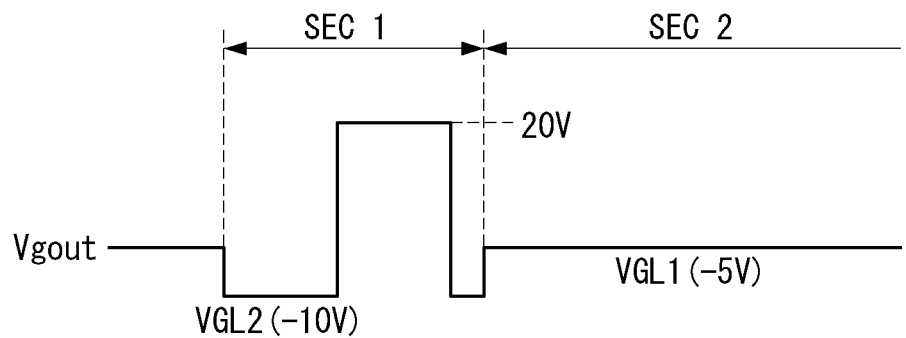

FIG. 12
SEC_1 (PBTS)
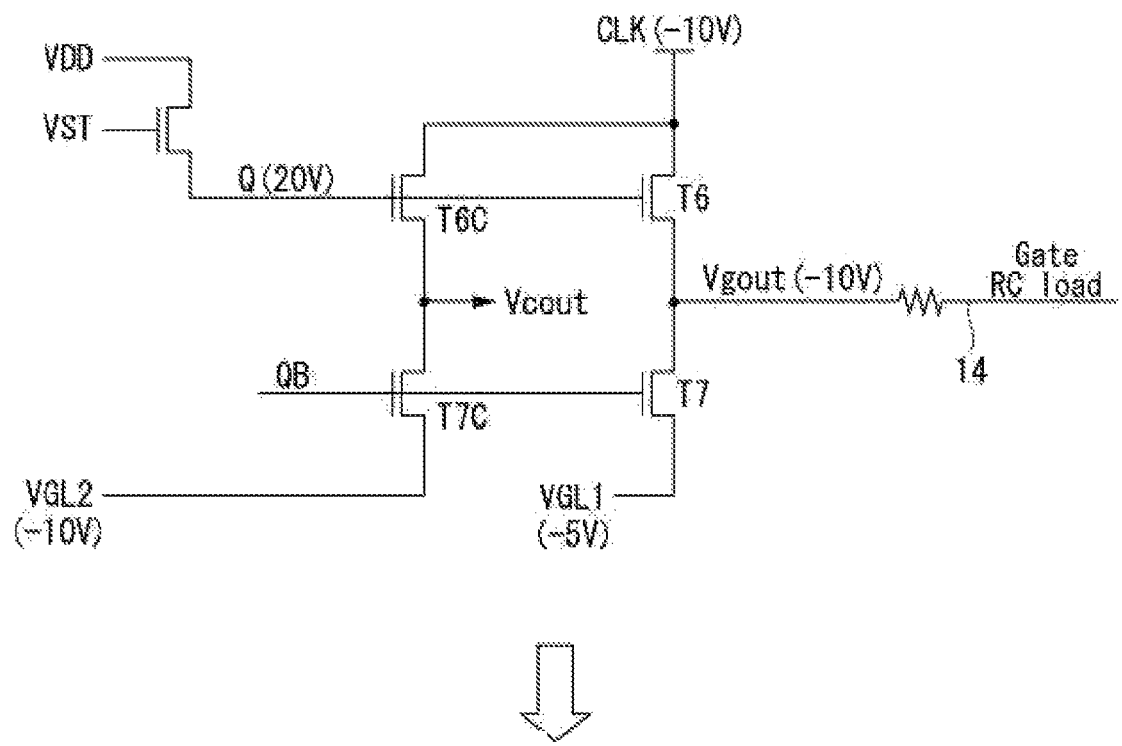
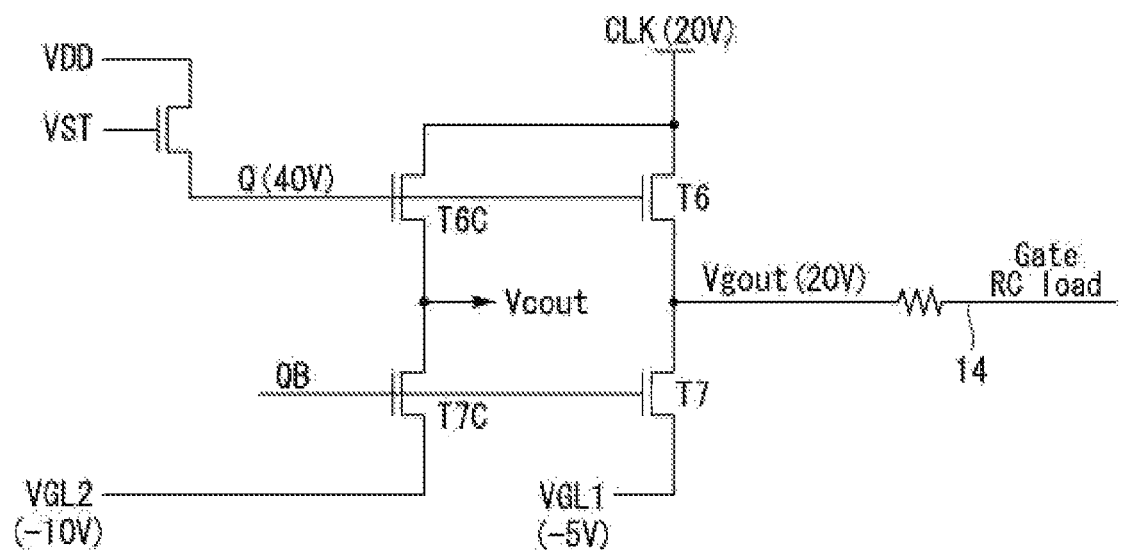

GATE DRIVE CIRCUIT AND DISPLAY DEVICE USING THE SAME

CROSS-REFERENCE TO RELATED APPLICATION

This application claims the priority benefit of Korean Patent Application No. 10-2016-0127118, filed Sep. 30, 2016, which is hereby incorporated herein by reference for all purposes as if fully set forth herein.

BACKGROUND

Technical Field

The present disclosure relates to a gate drive circuit and a display device using the same.

Description of the Related Art

A display device comprises a data drive circuit that feeds data signals to data lines on a pixel array, a gate drive circuit (or scan drive circuit) that sequentially feeds gate pulses (or scan pulses) to gate lines (or scan lines) on the pixel array, and a timing controller that controls the data drive circuit and the gate drive circuit.

Each pixel may comprise a thin-film transistor TFT that feeds a voltage from a data line to a pixel electrode in response to a gate pulse. The gate pulse swings between a gate-high voltage VGH and a gate-low voltage VGL. The gate-high voltage VGH is set higher than the threshold voltage of the pixel TFT, and the gate-low voltage VGL is set lower than the threshold voltage of the pixel TFT.

The technology for embedding the gate drive circuit, along with the pixel array, in a display panel is now used. The gate drive circuit embedded in the display panel is hereinafter referred to as a Gate In Panel (GIP) circuit. The GIP circuit comprises a shift register. The shift register comprises multiple stages connected as a cascade. The stages charge a Q node in response to a start pulse, produce output upon receipt of a shift clock, and transmit a carry signal as a start pulse to the next stage.

The stages of the shift register each comprise a Q node for charging the gate lines, a QB node for discharging the gate lines, and a switching circuit connected to the Q node and the QB node. The switching circuit charges the Q node in response to a start pulse or the output of the previous stage, and discharges the Q node in response to a carry signal from the next stage or a reset pulse.

The switching circuit comprises MOSFET (Metal Oxide Semiconductor Field Effect Transistor) transistors. The device characteristics of these transistors deteriorate due to DC gate bias stress.

FIG. 1 is a view showing an example of a shift in threshold voltage of a transistor due to DC gate bias stress on the transistor. In FIG. 1, Vgs(V) denotes the gate-source voltage of the MOSFET, and Ids(A) denotes the drain-source current of the MOSFET.

The higher the DC voltage applied to the gate of the transistor and the longer the DC voltage application time, the more the DC gate bias stress. The DC gate bias stress becomes severe with increasing temperature. When Vgs in FIG. 1, which is a positive voltage, is continuously applied to the gate of the transistor, the threshold voltage Vth of the transistor is shifted up to higher voltages due to positive gate bias stress as in FIG. 1, thereby reducing the On current. The threshold voltage shift due to DC gate bias stress is larger especially at high temperatures compared to room temperature, and thus has a more adverse effect on the reliability of the product in a high-temperature environment. Here, the applied temperature differs depending on the application of the product, and therefore, the temperature in the high-temperature environment may be defined in different ways depending on the application.

BRIEF SUMMARY

A GIP circuit comprises a number of switching elements, and its transistors are manufactured in large sizes in order to reduce the effect of DC gate bias stress on pull-up and pull-down transistors. A larger channel size for the transistors leads to a larger channel capacity for the transistors and therefore a larger amount of current, and this makes the transistors' outputs less sensitive to a shift in threshold voltage. Thus, in the related art, reducing the size of the pull-up and pull-down transistors in the GIP circuit is rather hard, making it difficult to achieve a narrow bezel on the display device.

In one embodiment, the present disclosure provides a gate drive circuit comprising: a first stage that outputs a first gate pulse at a first output terminal by increasing a voltage at the first output terminal when a first Q node is charged in response to receiving a first carry signal at a first start terminal, and decreasing the voltage at the first output terminal when a first QB node is charged; and a second stage that outputs a second gate pulse at a second output terminal and outputs a second carry signal at a third output terminal by increasing respective voltages at the second and third output terminals when a second Q node is charged in response to receiving the first carry signal at a second start terminal, and decreasing the voltages at the second and third output terminals when a second QB node is charged.

The first and second start terminals are connected together via a carry sharing node, and the first and second QB nodes are connected together via a QB sharing node. A voltage waveform on gate lines to which the first and second gate pulses are output includes a first section in which the voltage rises from a second gate-low voltage to a gate-high voltage and a second section in which the voltage is held at a first gate-low voltage. The first gate-low voltage is greater than the second gate-low voltage and less than the gate-high voltage.

The gate drive circuit may further include: a plurality of dummy stages connected as a cascade to the first and second stages; a first monitoring transistor connected to the Q node of at least one of the dummy stages; and a second monitoring transistor connected to the QB node of at least one of the dummy stages.

A first voltage for charging the first and second Q nodes may vary based on a deterioration sensing result from the first monitoring transistor, and a second voltage for charging the first and second QB nodes may vary based on a deterioration sensing result from the second monitoring transistor.

The first stage may include: a first pull-up transistor that pulls up the voltage of the first gate pulse by charging the first output terminal in response to the voltage at the first Q node; a first pull-down transistor that pulls down the voltage of the first gate pulse by discharging the first output terminal down to the first gate-low voltage in response to the voltage at the first QB node; a first transistor that charges the first Q node with the first voltage in response to the first carry signal; a second transistor that discharges the first Q node to the second gate-low voltage in response to a third carry signal; a third transistor that discharges the first Q node in response to the voltage at the first QB node; a fourth transistor that charges the first and second QB nodes with the second voltage; and a fifth transistor that discharges the first and second QB nodes in response to the voltage at the first Q node. The second carry signal is generated subsequent to the first carry signal and prior to the third carry signal.

The second stage may include: a second pull-up transistor that pulls up the voltage of the second gate pulse by charging the second output terminal in response to the voltage at the second Q node; a second pull-down transistor that pulls down the voltage of the second gate pulse by discharging the second output terminal down to the first gate-low voltage in response to the voltage at the second QB node; a third pull-up transistor that pulls up the voltage of the second carry signal by charging the third output terminal in response to the voltage at the second Q node; a third pull-down transistor that pulls down the voltage of the second carry signal by discharging the third output terminal down to the second gate-low voltage in response to the voltage at the second QB node; a sixth transistor that charges the second Q node with a VDD1 voltage in response to the first carry signal; a seventh transistor that brings the voltage at the second Q node down to the second gate-low voltage in response to the third carry signal; an eighth transistor that discharges the second Q node in response to the voltage at the second QB node; and a ninth transistor that discharges the second QB node in response to the voltage at the third output terminal.

The gate drive circuit may further include: a first comparator that senses a change in current through the first monitoring transistor; and a second comparator that senses a change in current through the second monitoring transistor. The change in current through the first monitoring transistor is converted into a first monitoring voltage through a resistor and input into a first input terminal of the first comparator. The change in current through the second monitoring transistor is converted into a second monitoring voltage through the resistor and input into a first input terminal of the second comparator. A given reference voltage is fed to second input terminals of the first and second comparators.

The first comparator changes the first voltage by amplifying a difference between the first monitoring voltage and the reference voltage. The second comparator changes the second voltage by amplifying a difference between the second monitoring voltage and the reference voltage.

The third output terminal provides the second carry signal to a subsequent third stage and a subsequent fourth stage.

In another embodiment, the present disclosure provides a display device that outputs gate pulses to gate lines on a display panel by using a gate drive circuit. The gate drive circuit includes a first stage and a second stage. The first stage is configured to output a first gate pulse at a first output terminal by increasing a voltage at the first output terminal when a first Q node is charged in response to receiving a first carry signal at a first start terminal, and decreasing the voltage at the first output terminal when a first QB node is charged. The second stage is configured to output a second gate pulse at a second output terminal and to output a second carry signal at a third output terminal that is coupled to two next stages by increasing respective voltages at the second and third output terminals when a second Q node is charged in response to receiving the first carry signal at a second start terminal, and decreasing the voltage at the second and third output terminals when a second QB node is charged. The first and second start terminals are connected together via a carry sharing node, and the first and second QB nodes are connected together via a QB sharing node. A voltage waveform on gate lines to which the first and second gate pulses are output includes a first section in which the voltage rises from a second gate-low voltage to a gate-high voltage and a second section in which the voltage is held at a first gate-low voltage, and the first gate-low voltage is greater than the second gate-low voltage and less than the gate-high voltage.

In yet another embodiment, the present disclosure provides a display device that includes a first gate output stage and a second gate output stage. The first gate output stages includes: a first start terminal configured to receive a first carry signal; a first Q node coupled to a gate terminal of a first pull-up transistor; a first QB node coupled to a gate terminal of a first pull-down transistor; and a first output terminal coupled between the first pull-up transistor and the first pull-down transistor, the first output terminal configured to output a first gate pulse to a first gate line. The second gate output stage includes: a second start terminal configured to receive the first carry signal, the second start terminal being coupled to the first start terminal of the first gate output stage; a second Q node coupled to a gate terminal of a second pull-up transistor and to a gate terminal of a third pull-up transistor; a second QB node coupled to a gate terminal of a second pull-down transistor and to a gate terminal of a third pull-down transistor, the second QB node further coupled to the first QB node of the first gate output stage; a second output terminal coupled between the second pull-up transistor and the second pull-down transistor, the second output terminal configured to output a second gate pulse to a second gate line; and a third output terminal coupled between the third pull-up transistor and the third pull-down transistor, the third output terminal configured to output a second carry signal.

BRIEF DESCRIPTION OF THE SEVERAL VIEWS OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings:

FIG. 10 is a block diagram showing voltage selectors, each of which being disposed between monitoring transistors and a comparator;

FIG. 11 is a waveform diagram showing an output voltage from a GIP circuit;

FIG. 12 is a circuit diagram showing PBTS (positive bias temperature stress) in a first section shown in FIG. 11.

DETAILED DESCRIPTION

Figure 1:
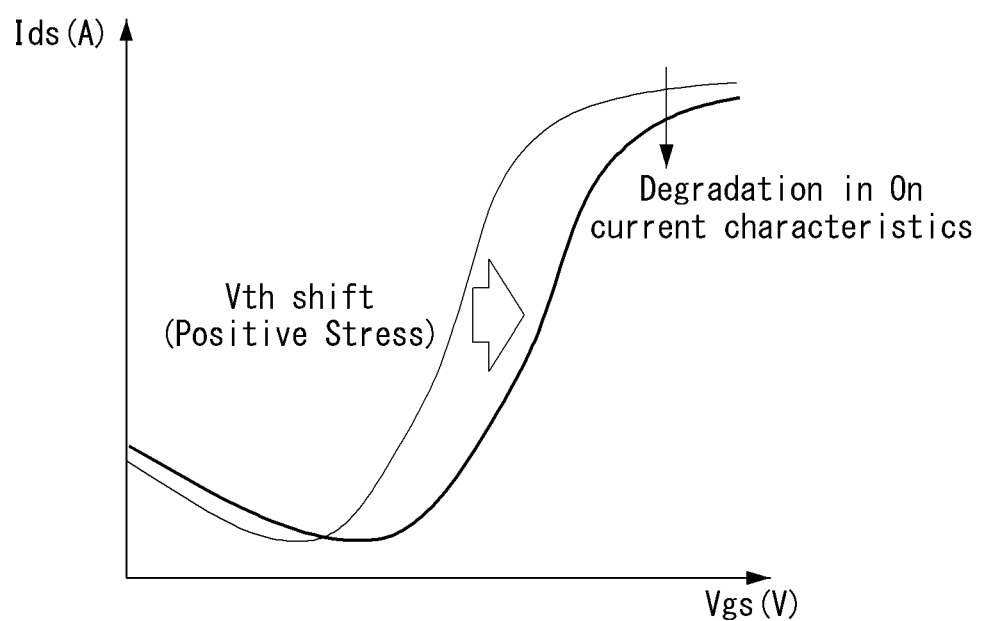
FIG. 1 is a graph showing an example of a positive shift in threshold voltage of a transistor due to DC gate bias stress on the transistor.

Advantages and features of the present disclosure and methods of accomplishing the same may be understood more readily by reference to the following detailed description of preferred embodiments and the accompanying drawings. The present disclosure may, however, be embodied in many different forms and should not be construed as being limited to the embodiments set forth herein. Rather, these embodiments are provided so that this disclosure will be thorough and complete and will fully convey the concept of the disclosure to those skilled in the art, and the present disclosure will only be defined by the appended claims.

The shapes, sizes, percentages, angles, numbers, etc. shown in the figures to describe the exemplary embodiments of the present disclosure are merely examples and embodiments of the present disclosure are not limited to those shown in the figures. Like reference numerals denote like elements throughout the specification. In describing the present disclosure, detailed descriptions of related well-known technologies will be omitted to avoid unnecessarily obscuring the present disclosure. When the terms "comprise," "have," "consist of" and the like are used, other parts may be added as long as the term "only" is not used. The singular forms may be interpreted as the plural forms unless explicitly stated to the contrary.

The elements may be interpreted to include an error margin even if not explicitly stated.

When the position relation between two parts is described using the terms "on," "over," "under," "next to" and the like, one or more parts may be positioned between the two parts as long as the term "immediately" or "directly" is not used.

It will be understood that, although the terms first, second, etc., may be used to describe various elements, these elements should not be limited by these terms. These terms are only used to distinguish one element from another element. Thus, a first element discussed below could be termed a second element without departing from the technical spirit of the present disclosure.

The features of various exemplary embodiments of the present disclosure may be combined with one another either partly or wholly, and may technically interact or work together in various ways. The exemplary embodiments may be carried out independently or in combination with one another.

Reference will now be made in detail to various embodiments of the disclosure, examples of which are illustrated in the accompanying drawings. Wherever possible or convenient for explanation, the same reference numbers will be used throughout the drawings to refer to the same or like parts. Detailed descriptions of known arts will be omitted if such may mislead or otherwise obscure the embodiments of the disclosure.

A display device of this disclosure may be implemented as a flat panel display, such as a liquid-crystal display (LCD) or an organic light-emitting (OLED) display. Although the following embodiment will be described by taking a liquid-crystal display as an example of the flat panel display, the present disclosure is not limited thereto. For example, a gate drive circuit of this disclosure is applicable to any display device that utilizes the gate drive circuit.

In the gate drive circuit of the present disclosure, switching elements may be implemented as n-type or p-type MOSFET (metal oxide semiconductor field effect transistor) transistors. It should be noted that, although the following exemplary embodiments are described with respect to n-type transistors, the present disclosure is not limited to them. A transistor is a three-electrode device with gate, source, and drain. The source is an electrode that provides carriers to the transistor. The carriers in the transistor flow from the source. The drain is an electrode where the carriers leave the transistor. That is, carriers in a MOSFET flow from the source to the drain. In the case of the n-type MOSFET (NMOS), the carriers are electrons, and thus the source voltage is lower than the drain voltage so that the electrons flow from the source to the drain. In the n-type MOSFET, since the electrons flow from the source to the drain, current flows from the drain to the source. In the case of the p-type MOSFET (PMOS), the carriers are holes, and thus the source voltage is higher than the drain voltage so that the holes flow from the source to the drain. In the p-type MOSFET, since the holes flow from the source to the drain, current flows from the source to the drain. It should be noted that the source and drain of a MOSFET are not fixed in position. For example, the source and drain of the MOSFET are interchangeable depending on the applied voltage. In the following description of the embodiments, the source and drain will be referred to as first and second electrodes. In the following description, it should be noted that the disclosure is not limited by the source and drain of a transistor.

The transistors constituting the gate drive circuit of this disclosure may be implemented as one or more of the following: a transistor comprising oxide semiconductor, a transistor comprising amorphous silicon (a-Si), and a transistor comprising low-temperature polysilicon (LTPS).

Figure 2:
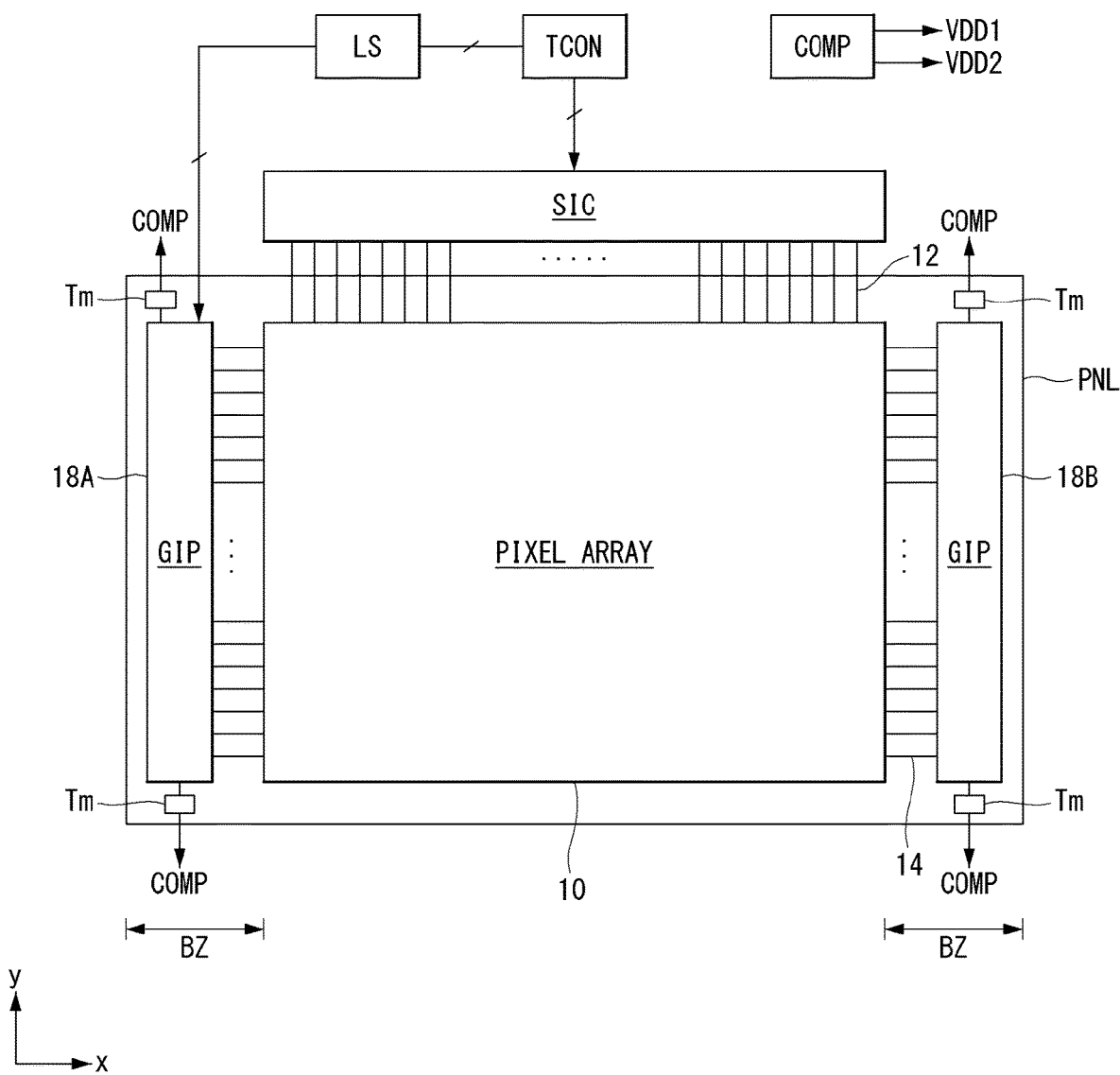
FIG. 2 is a block diagram schematically showing a display device according to an exemplary embodiment of the present disclosure.
Figure 3:
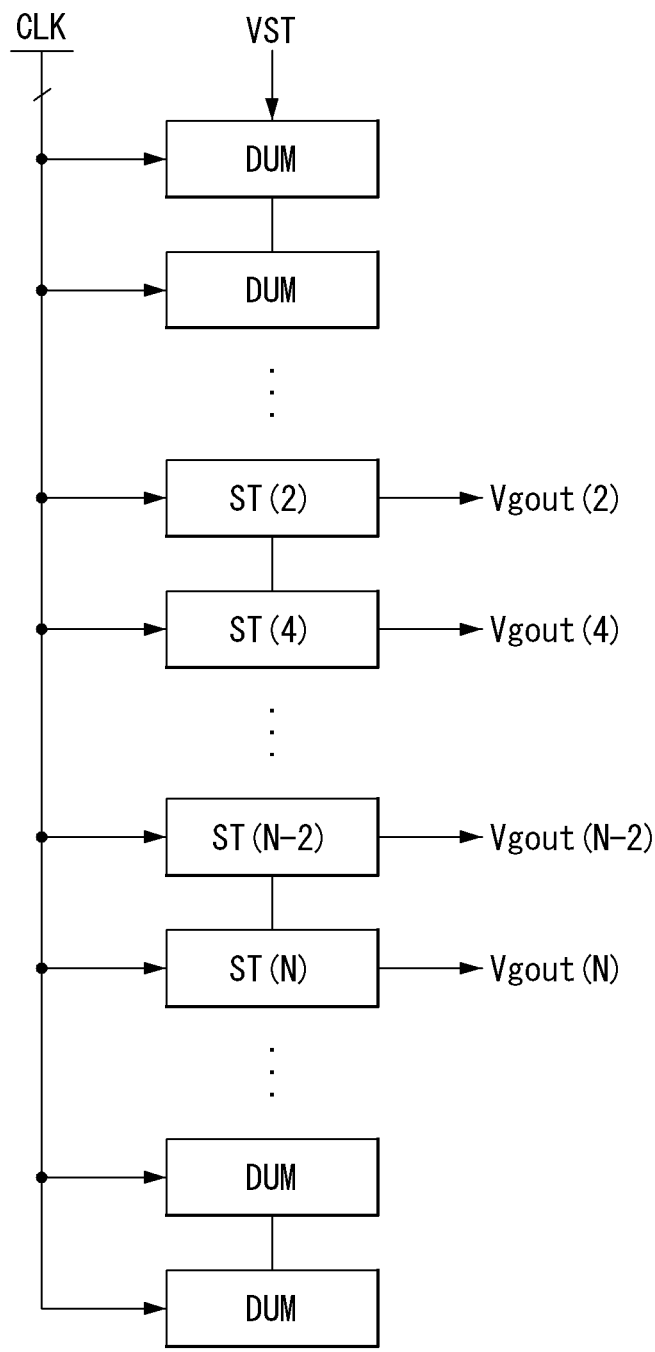
FIG. 3 is a block diagram showing a GIP circuit according to the present disclosure.
Figure 4:
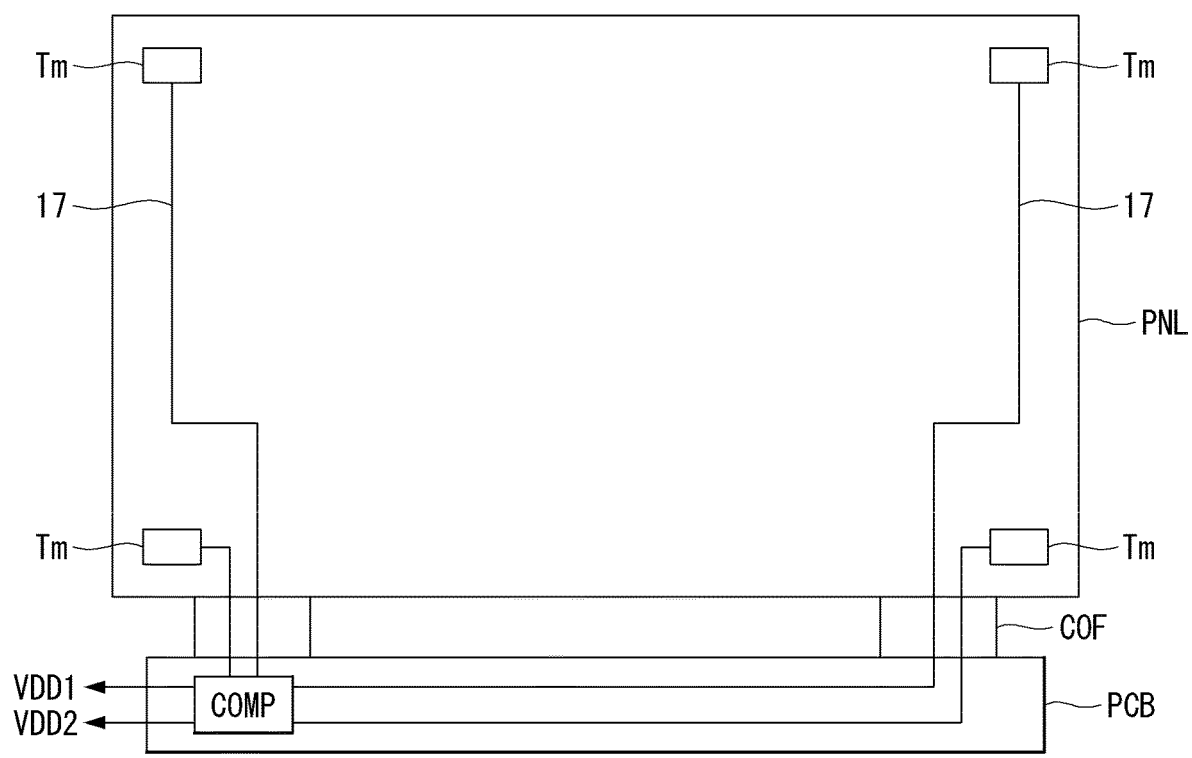
FIG. 4 is a block diagram showing monitoring transistors within a display panel.

Referring to FIGS. 2 to 4, a display device according to an exemplary embodiment of the present disclosure comprises a display panel PNL and a display panel drive circuit for writing data of an input image to a pixel array 10 on the display panel PNL.

The display panel PNL comprises data lines 12, gate lines 14 that are arranged in a direction transverse to the data lines 12, and a pixel array 10 of pixels arranged in a matrix defined by the data lines 12 and the gate lines 14. An input image is displayed on the pixel array.

The pixels in the pixel array 10 may comprise red (R), green (G), and blue (B) subpixels to produce colors. The pixels may further comprise white (W) subpixels in addition to the RGB subpixels.

The pixel array 10 on the display panel PNL may be divided into a TFT array and a color filter array. The TFT array may be formed on the lower substrate of the display panel PNL. The TFT array comprises TFTs (thin-film transistors) formed at the intersections of the data lines 12 and gate lines 14, pixel electrodes that are charged with data voltage, and storage capacitors Cst that are connected to the pixel electrodes and maintain data voltage, in order to display an input image.

The color filter array may be formed on the upper or lower substrate of the display panel PNL. The color filter array comprises a black matrix, color filters, etc. In a COT (Color Filter On TFT) or TOC (TFT on Color Filter) model, the color filters and the TFT array may be disposed on the TFT array.

A touchscreen using in-cell touch sensors may be implemented on the display panel PNL. The in-cell touch sensors are embedded in the pixel array of the display panel PNL. On-cell type or add-on type touch sensors may be disposed on the display panel PNL. The touch sensors may be implemented as capacitive touch sensors, for example, mutual-capacitance sensors or self-capacitance sensors.

The display panel drive circuit comprises a data driver SIC and a gate drive circuit and writes data of an input image to the pixels on the display panel PNL.

The data driver SIC comprises one or more source drive ICs. The source drive IC may be mounted on a COF (chip on film), which is a flexible circuit substrate, as shown in FIG. 4, and the display panel PNL may be connected to a PCB (printed circuit board). The data driver SIC may be bonded directly onto a substrate of the display panel PNL by a COG (chip on glass) process.

The data driver SIC converts digital video data of an input image received from the timing controller TCON to gamma compensation voltages to output data voltages. The data voltages output from the data driver SIC are fed to the data lines 12. A multiplexer (not shown) may be disposed between the data driver SIC and the data lines 12. The multiplexer distributes the data voltages input from the data driver SIC to the data lines 12 under control of the timing controller TCON. In case of a 1-to-2 multiplexer, the multiplexer feeds data voltages input through one output channel of the data driver SIC to two data lines in a time-division manner. Accordingly, the number of channels for the data driver SIC can be reduced to ½ by using the 1-to-2 multiplexer. Other multiplexers may be utilized in various embodiments provided herein, e.g., 1-to-3 multiplexers, 1-to-4 multiplexers, and so on.

The gate drive circuit comprises a GIP circuit 18A and 18B mounted directly on a TFT array substrate of the display panel PNL, and a level shifter LS disposed between the timing controller TCON and the GIP circuit 18A and 18B.

The GIP circuit 18A and 18B comprises a shift register. The GIP circuit 18A and 18B may be formed on a bezel BZ at one or two perimeters of the display panel PNL, outside the pixel array 10. The level shifter LS increases the voltage swing of a gate timing control signal to a gate-high voltage VGH and a gate-low voltage VGL and outputs the gate timing control signal to the GIP circuit 18A and 18B.

The GIP circuit 18A and 18B shifts gate pulses in synchronization with shift clocks CLK and sequentially feeds the gate pulses to the gate lines 14. The gate pulses swing between the gate-high voltage VGH and the gate-low voltage VGL. The gate-high voltage VGH is higher than the threshold voltage of the TFTs disposed in the pixel array 10. The gate-low voltage VGL is lower than the threshold voltage of the TFTs disposed in the pixel array 10. The TFTs in the pixel array turn on in response to the gate-high voltage VGH of the gate pulse, and thereby provide data voltages from the data lines 12 to the pixel electrodes.

The shift register in the GIP circuit 18A and 18B comprises stages that are connected as a cascade and shift their output at the timing of a shift clock CLK. Each of the stages outputs a gate pulse to a respective gate line 14 in response to a Q node voltage within the stage, and transmits a carry signal to another stage, i.e., to a subsequent stage cascaded to the stage. The gate pulse and the carry signal may be the same signal which is output through one output terminal, or may be separate signals which are provided through different output terminals.

The Q node of each stage is charged in response to a start pulse or a carry signal provided from a previous stage, and pre-charges the gate of a pull-up transistor. When a shift clock CLK is input while the Q node is in the pre-charged state, the Q node bootstraps through parasitic capacitance between the gate and drain of the pull-up transistor. When the voltage at the Q node rises by the bootstrapping, the pull-up transistor turns on to rise the voltage at the output terminal to the gate-high voltage VGH. At this time a voltage of the gate pulse rises. Gate pulses are fed to the gate lines 14 to simultaneously turn on TFTs on a line or row of pixels onto which data voltages are written. The QB node of each stage turns on a pull-down transistor to discharge the output terminal of the stage.

As shown in FIG. 3, the GIP circuit 18A and 18B comprises gate output stages ST(2) and ST(4) . . . ST(N) that output gate pulses and dummy stages DUM that do not output gate pulses. The gate output stages ST(2) and ST(4) . . . ST(N) are connected to respective gate lines 14 and sequentially feed gate pulses to the gate lines 14. In a case where the GIP circuit 18A and 18B is disposed at two opposite perimeters of the display panel PNL, the gate output stages ST(2) and ST(4) . . . ST(N) in the first GIP circuit 18A may sequentially output even-numbered gate pulses Vgout(2), Vgout(4), . . . Vgout(N), as shown in FIG. 3. The gate output stages in the second GIP circuit 18B (not shown) may sequentially output odd-numbered gate pulses. Alternatively, the GIP circuit 18A and 18B may apply gate pulses simultaneously to two sides of the gate lines 14. Accordingly, it should be noted that the GIP circuit 18A and 18B is not limited to what is shown in FIG. 3.

The dummy stages DUM are not connected to the gate lines 14. The dummy stages DUM output no gate pulses, but output carry signals only. The dummy stages DUM are connected as a cascade to the gate output stages ST(2) and ST(4) . . . ST(N), and have substantially the same circuit configuration as the stages ST(2) and ST(4) . . . ST(N).

Carry signals from the upper dummy stages DUM are applied to start terminals (or VST terminals) of the gate stages ST(2) and ST(4) and control the Q node pre-charging timing of the stages ST(2) and ST(4). Carry signals from the lower dummy stages DUM are applied to reset terminals (or VNEXT terminals) of the gate stages ST(N−2) and ST(N) and control the Q node discharging of the stages ST(N−2) and ST(N).

The timing controller TCON sends digital video data of an input image received from a host system (not shown) to the data driver SIC. The timing controller TCON receives timing signals, such as a vertical synchronization signal Vsync, a horizontal synchronization signal Hsync, a data enable signal DE, and a main clock MCLK, in synchronization with the input image data, and outputs a data timing control signal for controlling the operation timing of the data driver SIC and a gate timing control signal for controlling the operation timing of the GIP circuit 18A and 18B.

The gate timing control signal comprises a start pulse VST, a shift clock CLK, and an output enable signal GOE. The output enable signal GOE may be omitted. The start pulse VST is input into the VST terminal of the first dummy stage in the shift register, i.e., the upper dummy stage DUM as shown in FIG. 3, and controls the output timing of a first gate pulse, which is the first one that is generated during 1 frame. The shift clock CLK controls the output timing of a gate pulse from each stage to control the shift timing of the gate pulse.

The host system may be implemented as any one of the following: a television system, a set-top box, a navigation system, a DVD player, a Blu-ray player, a personal computer PC, a home theater system, and a phone system. The host system converts digital video data of an input image to a format suitable for display on the display panel PNL. The host system sends timing signals Vsync, Hsync, DE, and MCLK, along with the digital video data of the input image, to the timing controller TCON. The host system executes an application program associated with the coordinate information of a touch input from a touch sensing circuit (not shown).

As shown in FIG. 4, the display device according to one or more embodiments of the present disclosure comprises one or more monitoring transistors Tm formed on the display panel PNL and a comparator COMP that generates high-potential voltages VDD1 and VDD2 by comparing an output voltage of the monitoring transistor Tm to a given reference voltage.

Four monitoring transistors Tm may be distributed on the display panel PNL as shown in FIG. 4, but the present disclosure is not limited to such an arrangement or number of monitoring transistors Tm.

Figure 9:
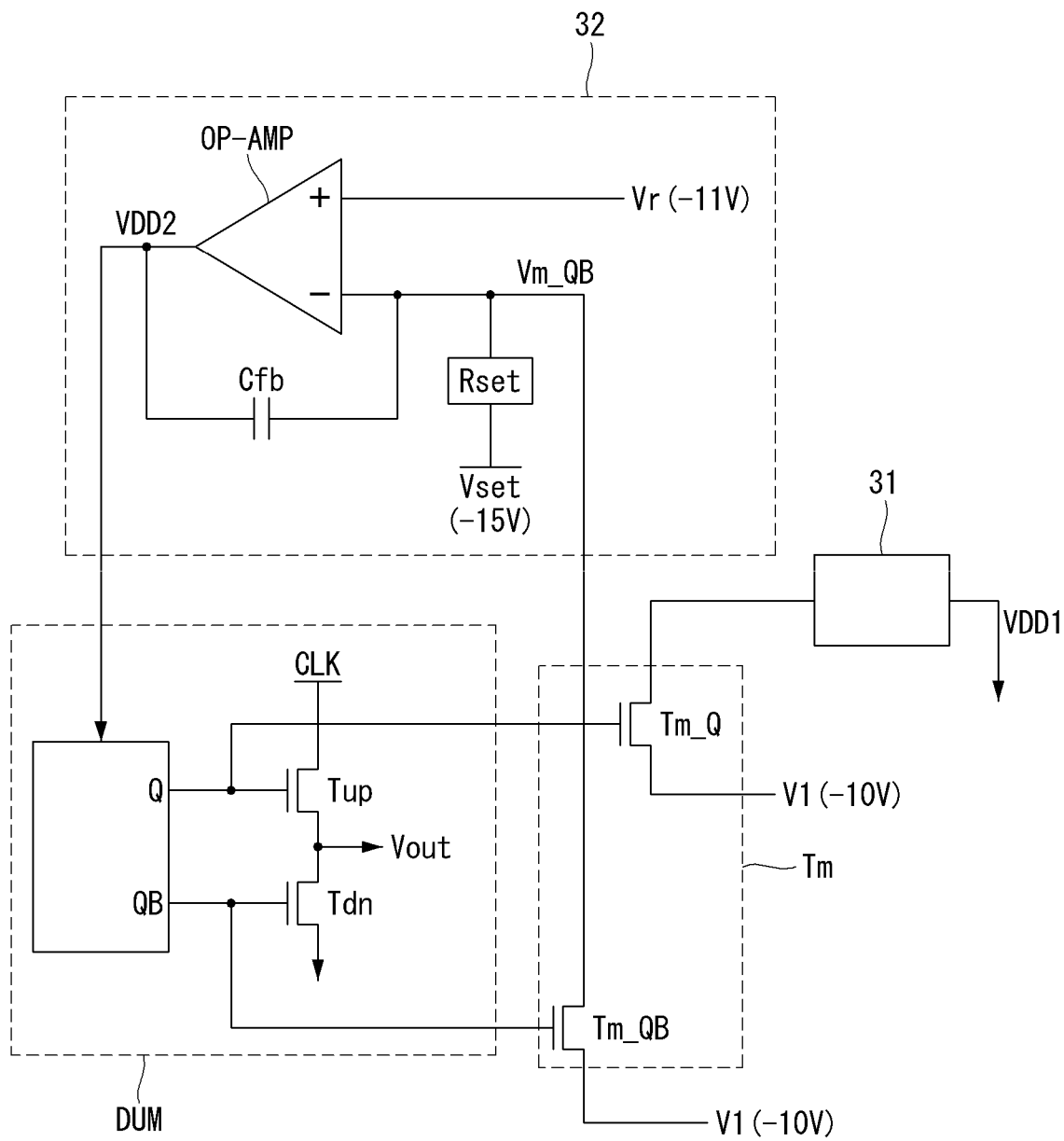
FIG. 9 is a circuit diagram showing in detail monitoring transistors and comparators.

The monitoring transistor Tm may be connected to the Q node and QB node of at least one of the dummy stages DUM as shown in FIG. 9, but the present disclosure is not limited to this. The monitoring transistor Tm may be connected to the Q node and/or QB node of a gate pulse output stage.

The monitoring transistor Tm turns on in response to the voltage at the Q node and/or QB node and outputs a monitoring voltage Vm to the comparator COMP. As shown in FIG. 4, the monitoring transistor Tm may be connected to the comparator COMP via a line 17 on the display panel PNL, 1 dummy channel line of the COF, and a line passing through the PCB. As shown in FIG. 9, the monitoring transistor Tm may comprise a first monitoring transistor Tm_Q connected to the Q node and a second monitoring transistor Tm_QB connected to the QB node. Each of the first and second monitoring transistors Tm_Q, Tm_QB outputs a respective monitoring voltage Vm_Q, Vm_QB, each of which may be referred to as a monitoring voltage Vm.

The comparator COMP compares the monitoring voltage Vm from the monitoring transistor Tm to a reference voltage Vr, and amplifies the difference to output first and second high-potential voltages VDD1 and VDD2. The first and second high-potential voltages VDD1 and VDD2 are generated at the same voltage level as the gate-high voltage VGH. The first high-potential voltage VDD1 is a voltage for charging the Q node Q. The second high-potential voltage VDD2 is a voltage for charging the QB node QB.

As shown in FIG. 4, the comparator COMP may be disposed on the PCB, along with the timing controller TCON and the level shifter LS. The comparator COMP amplifies the difference between the monitoring voltage Vm and the reference voltage Vr, and regulates the first and second high-potential voltages VDD1 and VDD2 in proportion to the difference. Accordingly, by the comparator COMP, the first and second high-potential voltages VDD1 and VDD2 are generated as voltages that vary in proportion to the difference between the monitoring voltage Vm and the reference voltage Vr.

The first and second high-potential voltages VDD1 and VDD2 increase in proportion to a shift in the threshold voltage of the pull-up/pull-down transistors connected to the Q node and QB node. These varying first and second high-potential voltages VDD1 and VDD2 may compensate for or decrease the effect of the shift in the threshold voltage of the transistors connected to the Q node and QB node and reduce the size of the transistors, thereby allowing for a reduction in bezel size, for example, as the pull-up and pull-down transistors may be manufactured with a reduced channel size in comparison to those of the related art.

Figure 5:
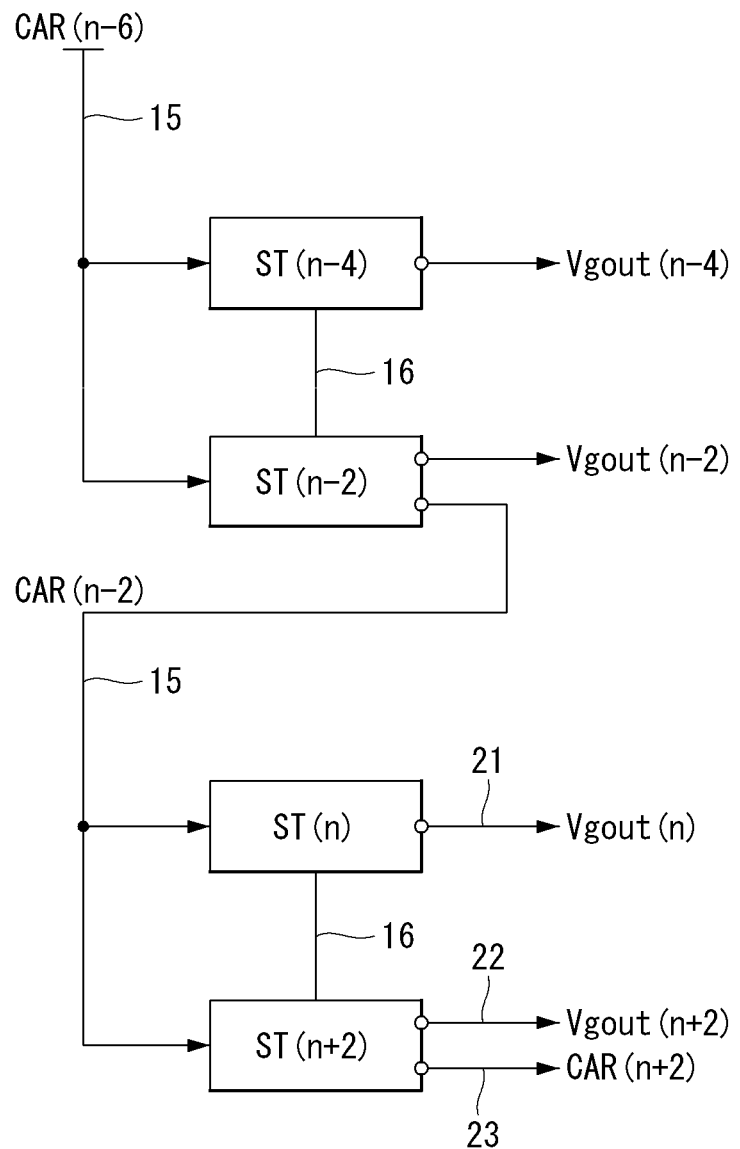
FIG. 5 is a block diagram schematically showing gate output stages in a GIP circuit.
Figure 6:
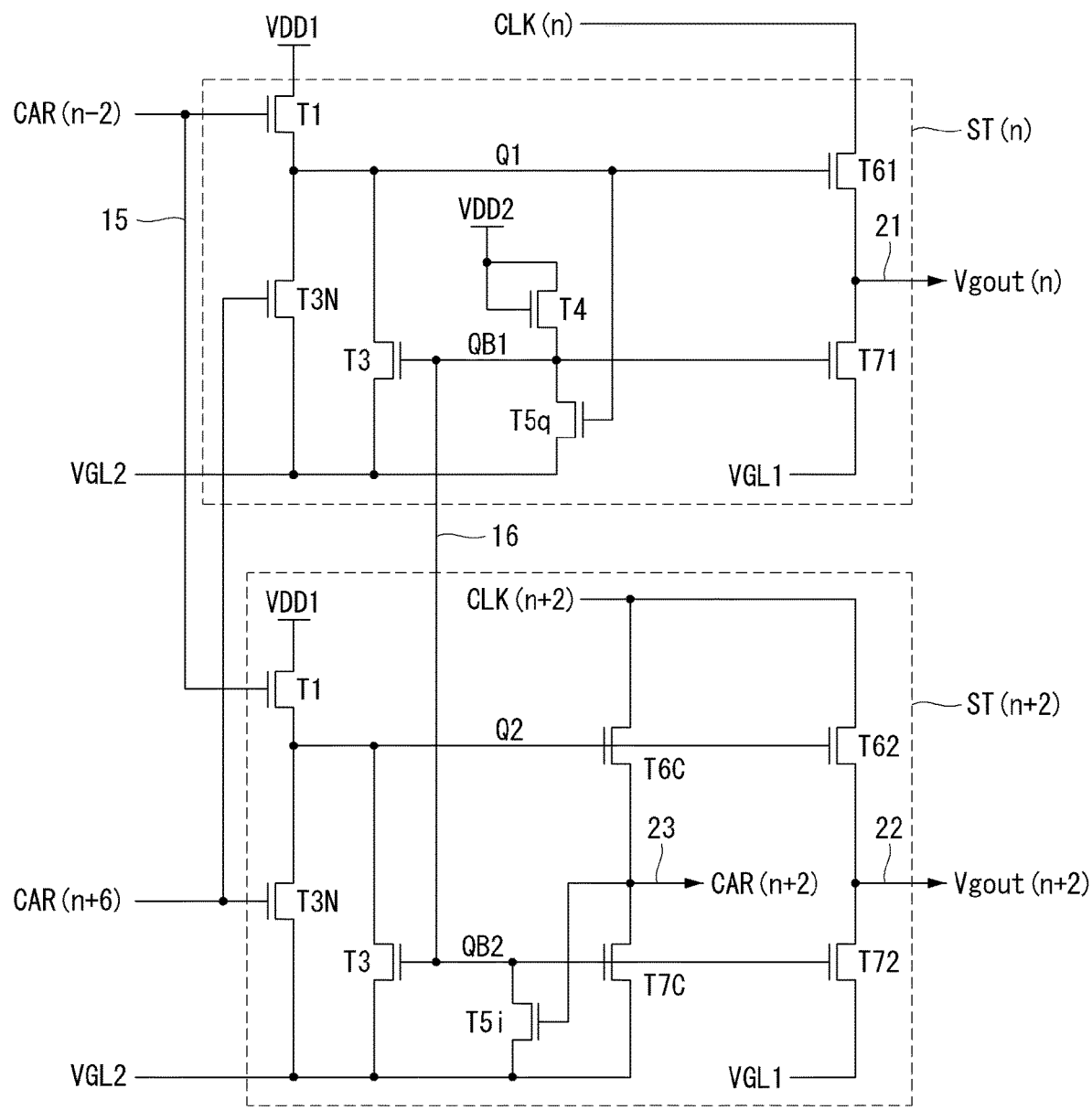
FIG. 6 is a circuit diagram showing in detail the gate output stage circuits of FIG. 5.
Figure 7:
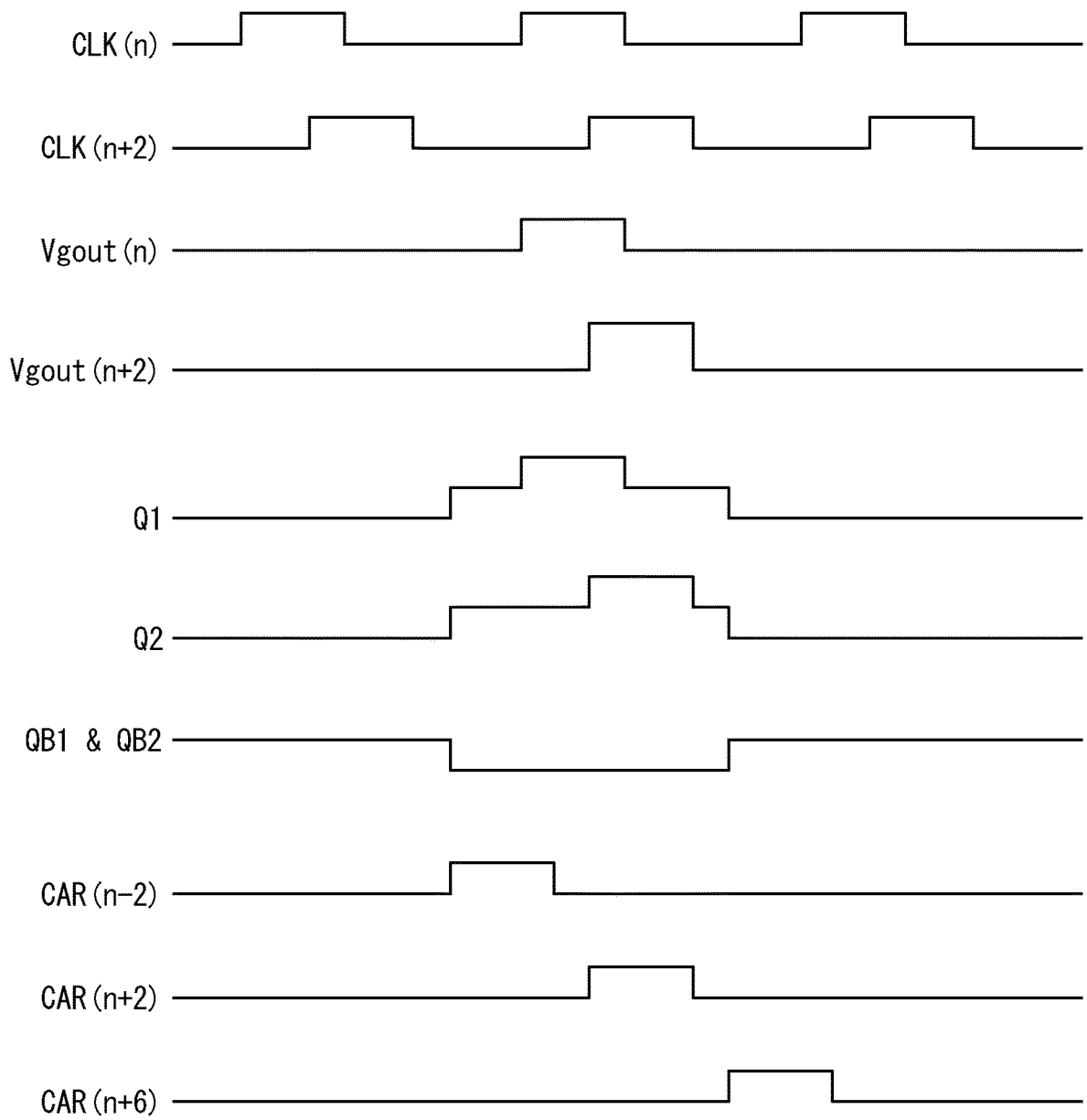
FIGS. 7 and 8 are waveform diagrams showing an operation of the GIP circuit.
Figure 8:
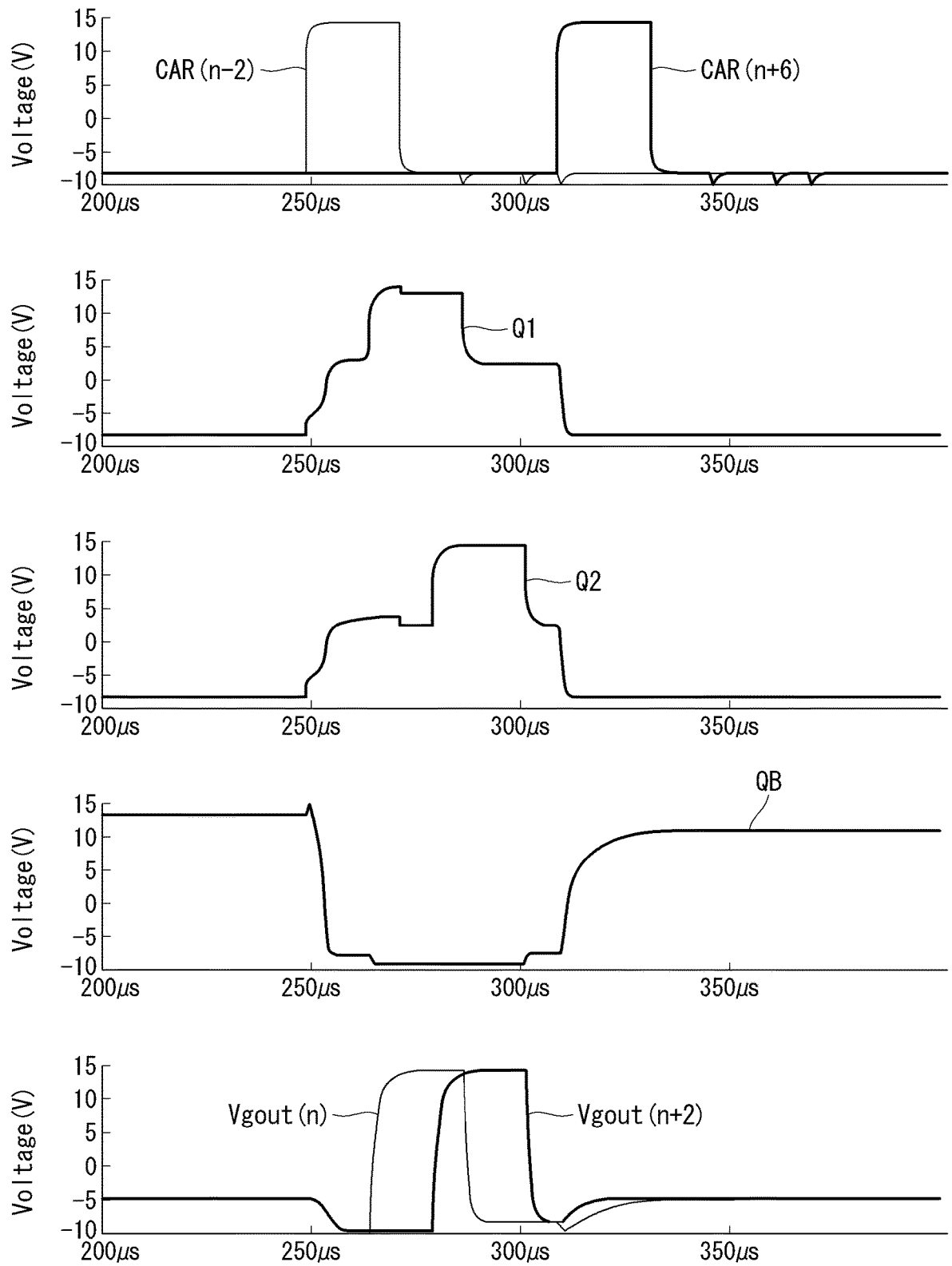

FIG. 5 is a block diagram schematically showing gate output stages in a GIP circuit. FIG. 6 is a circuit diagram showing in detail the gate output stage circuits of FIG. 5. FIGS. 7 and 8 are waveform diagrams showing an operation of the GIP circuit.

Referring to FIGS. 5 to 8, the GIP circuit according to embodiments of the present disclosure comprises neighboring gate output stages ST(n) and ST(n+2) that share a carry sharing node 15 and a QB sharing node 16. The carry sharing node 15 is connected to the VST terminals of the neighboring gate output stages ST(n) and ST(n+2). The QB sharing node 16 connects the QB nodes QB1 and QB2 of the neighboring gate output stages ST(n) and ST(n+2).

The neighboring gate output stages ST(n) and ST(n+2) are stages whose Q nodes are charged simultaneously in response to the same carry signal, and that sequentially generate outputs in response to sequential clocks CLK(n) and CLK(n+2). The outputs from the stages are divided into gate pulses Vgout(n) and Vgout(n+2) to be applied to gate lines 14 and a second carry signal CAR(n+2) to be transmitted to another stage.

The neighboring gate output stages ST(n) and ST(n+2) are illustrated as, but not limited to, the nth stage ST(n) and (n+2)th stage ST(n+2) (n is a positive integer greater than 0), as in the example of FIGS. 5 and 6. In a case where the GIP circuit is provided on one side of the display panel PNL, the neighboring gate output stages may be the nth and (n+1)th stages. Hereinafter, the nth stage ST(n) will be referred to as a first stage, and the (n+2)th stage ST(n+2) will be referred to as a second stage.

The first stage ST(n) increases the voltage at a first output terminal 21 when the voltage at a first Q node Q1 is charged, and decreases the voltage at the first output terminal 21 when the voltage at a first QB node QB1 is charged. Thus, the first stage ST(n) outputs a first gate pulse through the first output terminal 21. The first gate pulse is fed to a first gate line on the display panel PNL1. The first stage ST(n) does not output a carry signal. The voltage at the first Q node Q1 is charged upon receipt of a start pulse through a first start terminal of the first stage ST(n) or upon receipt of a first carry signal CAR(n−2) from the previous stage.

The second stage ST(n+2) increases the voltages at second and third output terminals 22 and 23 when the voltage at a second Q node Q2 is charged, and decreases the voltages at the second and third output terminals 22 and 23 when the voltage at a second QB node QB2 is charged. Thus, the second stage ST(n+2) outputs a second gate pulse through the second output terminal 22 and at the same time outputs a second carry signal CAR(n+2) through the third output terminal 23, which is transmitted to the next two stages. The voltage at the second Q node Q2 is charged when the first carry signal CAR(n−2) is input through a second start terminal of the second stage ST(n+2). The second gate pulse is fed to a second gate line on the display panel PNL1. Therefore, in the GIP circuit of embodiments of this disclosure, the stages ST(n−4) and ST(n) output a gate pulse only, and the stages ST(n−2) and ST(n+2) output both a gate pulse and carry signal. That is, the stages may be alternately arranged, with stages that output only a gate pulse (e.g., ST(n−4) and ST(n)) being positioned between stages that output both a gate pulse and a carry signal (e.g., ST(n−2) and ST(n+2)).

The VST terminals of the first and second stages ST(n) and ST(n+2) are connected together through the carry sharing node 15. Thus, the Q nodes Q1 and Q2 of the first and second stages ST(n) and ST(n+2) are charged simultaneously upon receipt of the first carry signal CAR(n−2).

The QB nodes QB1 and QB2 of the first and second stages ST(n) and ST(n+2) are charged and discharged simultaneously since they are connected together through the QB sharing node 16.

The first stage ST(n) comprises a first pull-up transistor T61 that charges the first output terminal 21 connected to the first gate line in response to the voltage at the first Q node Q1 to cause the first gate pulse Vgout(n) to rise, a first pull-down transistor T71 that discharges the first output terminal down to VGL1 in response to the voltage at the first QB node QB1 to cause the first gate pulse Vgout(n) to fall, a first transistor T1 that charges the first Q node Q1 with the VDD1 voltage in response to the first carry signal CAR(n−2), a second transistor T3N that discharges the first Q node Q1 down to VGL2 in response to a third carry signal CAR(n+6), a third transistor T3 that discharges the first Q node Q1 in response to the voltage at the first QB node QB1, a fourth transistor T4 that charges the first and second QB nodes QB1 and QB2 with the VDD2 voltage, and a fifth transistor T5q that discharges the QB nodes QB1 and QB2 in response to the voltage at the first Q node Q1.

The first stage ST(n) is connected to the second stage ST(n+2) through the carry sharing node 15 and the QB sharing node 16. The carry sharing node 15 sends the carry signal CAR(n−2) to the two neighboring stages ST(n) and ST(n+2). The QB sharing node 16 connects the QB nodes QB1 and QB2 of the two neighboring stages ST(n) and ST(n+2). Thus, the present disclosure may reduce the number of carry sharing nodes in the GIP circuit 18A and 18B and the number of transistors and lines for charging the QB nodes QB1 and QB2. As a result, the present disclosure may reduce the size of the GIP circuit and therefore reduce the size of the bezel on the display device by that amount.

The second stage ST(n+2) requires no transistor for charging the second QB node QB2 since it shares the QB node with the first stage ST(n). The second stage ST(n+2) outputs the second carry signal CAR(n+2) that acts as a start pulse for the next stages.

The second stage ST(n+2) comprises a second pull-up transistor T62 that charges the second output terminal 22 connected to the second gate line in response to the voltage at the second Q node Q2 to cause the second gate pulse Vgout(n+2) to rise, a second pull-down transistor T72 that discharges the second output terminal down to VGL1 in response to the voltage at the second QB node QB2 to cause the second gate pulse Vgout(n+2) to fall, a third pull-up transistor T6C that charges the third output terminal 23 in response to the voltage at the second Q node Q2 to cause the second carry signal CAR(n+2) to rise, a third pull-down transistor T7C that discharges the third output terminal 23 down to VGL2 in response to the voltage at the second QB node QB2 to cause the second carry signal CAR(n+2) to fall, a sixth transistor T1 that charges the second Q node Q2 with the VDD1 voltage in response to the first carry signal CAR(n−2), a seventh transistor T3N that discharges the second Q node Q2 down to VGL2 in response to the third carry signal CAR(n+6), an eighth transistor T3 that discharges the second Q node Q2 in response to the voltage at the second QB node QB2, and a ninth transistor T5i that discharges the second QB node QB2 in response to the voltage at the third output terminal 23.

The first carry signal CAR(n−2) may be output from, but not limited to, the previous stage, for example, the (n−2)th stage ST(n−2), which produces output prior to the first stage ST(n). The third carry signal CAR(n+6) may be output from, but not limited to, the subsequent stage, for example, the (n+6)th stage ST(n+6), which produces output subsequent to the second stage ST(n+2). The second carry signal CAR(n+2) output from the second stage ST(n+2) is generated subsequent to the first carry signal CAR(n−2) and prior to the third carry signal CAR(n+6). The third output terminal 23 is connected to the VST terminals of the next two stages through the carry sharing node 15. Thus, the second carry signal CAR(n+2) is applied simultaneously to the VST terminals of the next two stages.

VDD1 and VDD2 each may be generated at the gate-high voltage VGH or above. VDD1 is a voltage for charging the Q nodes Q1 and Q2. VDD2 is a voltage for charging the QB nodes QB1 and QB2. VGL1 and VGL2 are gate-low voltages with different voltage levels. VGL1 is set higher than VGL2 and lower than VGH. VGL1 increases the source voltage of the pull-up transistors T61 and T62 to a level higher than the gate voltage thereof so that negative bias stress is applied to the transistors, thereby reducing deterioration of the transistors due to positive stress. Accordingly, the present disclosure may reduce the size of the transistors since stress on the transistors can be reduced by compensating for positive stress on the transistors by negative stress. As a result, the present disclosure allows for a reduction in the size of the bezel on the display device.

The transistors T1, T3, T3N, T4, T5q, T5i, T61, T62, T6C, T71, T72, and T7C and monitoring transistor Tm constituting the stages in the GIP circuit may be implemented as MOSFETs of the same type. These transistors may be implemented as, but not limited to, NMOS or PMOS. The transistors T1, T3, T3N, T4, T5q, T5i, T61, T62, T6C, T71, T72, T7C and Tm may be PMOS transistors. These transistors may be implemented as NMOS transistors having an oxide semiconductor channel.

Hereinafter, a circuit configuration of the first and second stages ST(n) and ST(n+2) will be described in detail based on the connections among the transistors.

The first pull-up transistor T61 charges the first output terminal 21 up to the VGH voltage of a first shift clock CLK(n) when the first shift clock CLK(n) is input through a first CLK terminal while the first Q node Q1 is charged at the VDD1 voltage. The first Q node Q1 is charged up to the VGH voltage due to the VDD1 voltage and, when the first shift clock CLK(n) is generated, the first Q node Q1 bootstraps through parasitic capacitance between the gate and first electrode of the first pull-up transistor T61 and its voltage rises up to 2 VGH to thereby turn on the first pull-up transistor T61. When the first pull-up terminal 21 is charged by the first pull-up transistor T61, the first gate pulse is then fed to the first gate line 14. The first pull-up transistor T61 comprises the gate connected to the first Q node Q1, the first electrode connected to the first CLK terminal, and a second electrode connected to the first output terminal 21.

The first pull-down transistor T71 discharges the first output terminal 21 down to VGL1 in response to the voltage at the first QB node QB1. The first pull-down transistor T71 comprises a gate connected to the first QB node QB1, a first electrode connected to the first output terminal 21, and a second electrode connected to a VGL1 terminal.

The first and sixth transistors T1 each pre-charge the Q node Q1 or Q2 by applying VDD1 to the Q node in response to a start pulse or the first carry signal CAR(n−2). The voltage at the Q node Q1 or Q2 is boosted up to the VGH voltage as the Q node Q1 or Q2 is charged with a voltage applied through the first transistor T1. The first and sixth transistors T1 each comprise a gate connected to the VST terminal, a first electrode connected to a VDD1 terminal, and a second electrode connected to the Q node Q1 or Q2.

The second and seventh transistors T3N each discharge the Q node Q1 or Q2 down to VGL2 by connecting the Q node Q1 or Q2 to a VGL2 terminal in response to the third carry signal CAR(n+6). The second and seventh transistors T3N each comprise a gate into which the third carry signal CAR(n+6) is input, a first electrode connected to the Q node Q1 or Q2, and a second electrode connected to the VGL2 terminal.

The third and eighth transistors T3 each discharge the Q node Q1 or Q2 down to VGL2 in response to the voltage at the QB node QB1 or QB2. The third and eighth transistors T3 each comprise a gate connected to the QB node QB1 or QB2, a first electrode connected to the Q node Q1 or Q2, and a second electrode connected to the VGL2 terminal.

The fourth transistor T4 acts as a diode and feeds VDD2 to the QB nodes QB1 and QB2. A gate and first electrode of the fourth transistor T4 are connected to a VDD2 terminal. A second electrode of the fourth transistor T4 is connected to the QB nodes QB1 and QB2.

The fifth transistor T5$q$ of the first stage ST(n) discharges the QB nodes QB1 and QB2 by connecting the QB nodes QB1 and QB2 to the VGL2 terminal in response to the first Q node Q1. The fifth transistor T5$q$ comprises a gate connected to the first Q node Q1, a first electrode connected to the QB nodes QB1 and QB2, and a second electrode connected to the VGL2 terminal.

The second pull-up transistor T62 charges the second output terminal 22 up to the VGH voltage of a second shift clock CLK(n+2) when the second shift clock CLk(n+2) is input through a second CLK terminal while the second Q node Q2 is charged at the VDD1 voltage. The second Q node Q2 is charged up to the VGH voltage due to the VDD1 voltage and, when the second shift clock CLK(n+2) is generated, the second Q node Q2 bootstraps through parasitic capacitance between the gate and first electrode of the second pull-up transistor T62 and its voltage rises up to 2 VGH to thereby turn on the second pull-up transistor T62. When the second pull-up terminal 22 is charged by the second pull-up transistor T62, the second gate pulse is then fed to the second gate line 14. The second pull-up transistor T62 comprises the gate connected to the second Q node Q2, the first electrode connected to the second CLK terminal, and a second electrode connected to the second output terminal 22.

The second pull-down transistor T72 discharges the second output terminal 22 down to VGL1 in response to the voltage at the second QB node QB2. The second pull-down transistor T72 comprises a gate connected to the second QB node QB2, a first electrode connected the second output terminal 22, and a second electrode connected to the VGL1 terminal.

The third pull-up transistor T6C charges the third output terminal 23 up to the VGH voltage of the second shift clock CLK(n+2) when the second shift clock CLk(n+2) is input through the second CLK terminal while the second Q node Q2 is charged at the VDD1 voltage. The second Q node Q2 is charged up to the VGH voltage due to the VDD1 voltage and, when the second shift clock CLK(n+2) is generated, the second Q node Q2 bootstraps through parasitic capacitance between the gate and first electrode of the third pull-up transistor T6C and its voltage rises up to 2VGH to thereby turn on the third pull-up transistor T6C. When the third pull-up terminal 23 is charged by the third pull-up transistor T6C, the second carry signal CAR(n+2) is generated, thereby charging the Q nodes of the next stages ST(n+4) and ST(n+6). The third pull-up transistor T6C comprises the gate connected to the second Q node Q2, the first electrode connected to the second CLK terminal, and a second electrode connected to the third output terminal 23.

The third pull-down transistor T7C discharges the third output terminal 23 down to VGL2 in response to the voltage at the second QB node QB2. The third pull-down transistor T7C comprises a gate connected to the second QB node QB2, a first electrode connected the third output terminal 23, and a second electrode connected to the VGL2 terminal.

The ninth transistor T5$i$ charges the QB nodes QB1 and QB2 by connecting the QB nodes QB1 and QB2 to the VGL2 terminal in response to the voltage at the third output terminal 23. The ninth transistor T5$i$ comprises a gate connected to the third output terminal 23, a first electrode connected to the QB nodes QB1 and QB2, and a second electrode connected to the VGL2 terminal.

The shift clocks CLK(n) and CLK(n+2) may swing between VGH and VGL2. For VGH=20 V, VGL1=−5 V, and VGL2=−10 V, the input and output waveforms from the GIP circuit 18A and 18B are as shown in FIG. 8. When the Q nodes Q1 and Q2 are charged at VGH or above, the gate voltages Vgout(n) and Vgout(n+2) output through the first and second output terminals 21 and 22 are held at VGL1 while the QB nodes QB1 and QB2 are charged at the VGH voltage. Then, the gate voltages Vgout(n) and Vgout(n+2) drop to VGL2 due to VGL2(−10V) of the shift clocks CLK(n) and CLK(n+2), and then rise to VGH (20 V) of gate pulses. In contrast, the carry signals CAR(n−2), CAR(n+2), and CAR(n+6) output through the third output terminal 23 are held at VGL2(−10V) when the QB nodes QB1 and QB2 are charged at VGH or above, and rise to the VGH voltage when the second node Q2 bootstraps by the second shift clock CLK(n+2).

FIG. 9 is a circuit diagram showing in detail monitoring transistors and comparators. FIG. 10 is a view showing voltage selectors, each of which being disposed between monitoring transistors and a comparator.

Referring to FIGS. 9 and 10, the monitoring transistor Tm comprises a first monitoring transistor Tm_Q connected to a Q node in the GIP circuit 18A and 18B and a second monitoring transistor Tm_QB connected to a QB node in the GIP circuit 18A and 18B. The monitoring transistors Tm_Q and Tm_QB may be connected to, but not limited to, the Q node and QB node of a dummy stage DUM. The output voltage Vout of the dummy stage DUM is transmitted as a voltage of a carry signal to another stage.

The first monitoring transistor Tm_Q is a transistor that has substantially the same structure as a pull-up transistor Tup, and comprises a gate connected to the Q node to which the gate of the pull-up transistor Tup also is connected. If the pull-up transistor Tup deteriorates due to gate bias stress, the first monitoring transistor Tm_Q sharing the same Q node also is subjected to the stress the pull-up transistor Tup is subjected to, and therefore deteriorates to the same extent that the pull-up transistor Tup deteriorates. Accordingly, the first monitoring transistor Tm_Q may be used to detect deterioration of the pull-up transistor Tup.

The second monitoring transistor Tm_QB is a transistor that has substantially the same structure as a pull-down transistor Tdn, and comprises a gate connected to the QB node to which the gate of the pull-down transistor Tdn also is connected. If the pull-down transistor Tdn deteriorates due to gate bias stress, the second monitoring transistor Tm_QB sharing the same QB node also is subjected to the stress the pull-down transistor Tdn is subjected to, and therefore deteriorates to the same extent that the pull-down transistor Tdn deteriorates. Accordingly, the second monitoring transistor Tm_QB may be used to detect deterioration of the pull-down transistor Tdn.

The comparator COMP comprises a first comparator 31 that varies VDD1 by detecting deterioration of the first monitoring transistor Tm_Q and a second comparator 32 that varies VDD2 by detecting deterioration of the second monitoring transistor Tm_QB.

The first comparator 31 and the second comparator 32 have substantially the same circuit configuration and operate on substantially the same principle. An operation of the comparator 32 will be described with respect to the second comparator 32, the details of which are shown in FIG. 9. The details of the first comparator 31 are not shown in FIG. 9, as the first comparator 31 has a substantially same circuit configuration as the second comparator 32.

The comparators 31 and 32 comprise an operational amplifier OP-AMP that amplifies the difference between two input signals.

A reference voltage Vr is applied to a non-inverting input terminal (+) of the operational amplifier OP-AMP. A first electrode of the second monitoring transistor Tm_QB is connected to an inverting input terminal (−) of the operational amplifier OP-AMP. A monitoring voltage Vm is applied from the monitoring transistors Tm_Q and TM_QB to the inverting input terminal (−) of the operational amplifier OP-AMP. A feedback capacitor Cfb is connected between the inverting input terminal (−) and output terminal of the operational amplifier OP-AMP. An initial setting voltage Vset is applied to the inverting input terminal (−) of the operational amplifier OP-AMP through a resistor Rset. The operational amplifier OP-AMP amplifies the difference between two input signals to output VDD (e.g., VDD1 output by the first comparator 31 and VDD2 output by the second comparator 32). The larger the difference between the monitoring voltage Vm and the reference voltage Vr, the higher the voltage level of VDD (VDD1 and VDD2) output from the operational amplifier OP-AMP. Thus, if Vm decreases with a shift in the threshold voltage of the monitoring transistors Tm_Q and Tm_QB due to gate bias stress, the operational amplifier OP-AMP increases VDD (VDD1 and VDD2) until Vm and Vr become equal.

The comparators 31 and 32 detect deterioration of the monitoring transistors Tm_Q and Tm_QB, from the initial low voltage of VDD (VDD1 and VDD2). To this end, Vr may be set to −11 V and V1 may be set to −10 V, but they are not limited thereto. The initial setting voltage Vset may be set to −15 V, but it is not limited thereto. The voltages Vset, Vr, and V1 are set in such a way that they do not cause trouble with the initial operation of the comparators 31 and 32 and can cope with deterioration of the GIP circuit 18A and 18B in a usage environment, so as to detect deterioration of the monitoring transistors Tm_Q and Tm_QB, from the initial low voltage of VDD (VDD1 and VDD2). These voltages Vset, Vr, and V1 are experimentally determined since they may vary depending on the model or driving characteristics of the display device.

The comparators 31 and 32 increase VDD (VDD1 and VDD2) from Vset by sensing a degree of deterioration based on a decrease in current through the transistors Tm_Q and Tm_QB relative to the initial on current Ion of the monitoring transistors Tm_Q and Tm_QB. As the monitoring transistors Tm_Q and Tm_QB deteriorate due to gate bias stress, the current Ion decreases and this current decrease is transformed into the voltage Vm through the resistor Rset, input into the operational amplifier OP-AMP, and compared with the reference voltage Vref. The operational amplifier OP-AMP increases VDD (VDD1 and VDD2) when Vm becomes equal to Vref. This up-regulated VDD (VDD1 and VDD2) increases the voltages at the Q node and QB node to thereby increase the gate voltage of the monitoring transistors Tm_Q and Tm_QB and reduce channel resistance, which results in a rise in Vm. By the operational amplifier OP-AMP, VDD (VDD1 and VDD2) rises until Vm becomes equal to Vref.

As shown in FIG. 4, a plurality of monitoring transistors Tm may be disposed within the display panel PNL. The comparators 31 and 32 may regulate VDD (VDD1 and VDD2) upon receipt of Vm from any one of the monitoring transistors Tm, or may regulate VDD (VDD1 or VDD2) upon receipt of Vms from the plurality of monitoring transistors Tm, as shown in FIG. 10.

In the present disclosure, stress on the pull-up and pull-down transistors in the GIP circuit 18A and 18B may be compensated for by regulating the voltages VDD1 and VDD2 for charging the Q node and the QB node depending on the degree of deterioration of the transistors Tm_Q and Tm_QB. Thus, the present disclosure may reduce the size of the pull-up and pull-down transistors, thereby allowing for a reduction in the size of the bezel on the display device.

Referring to FIG. 10, the display device according to the present disclosure comprises a first selector 41 disposed between a plurality of first monitoring transistors Tm_Q1 to Tm_Q4 and a first comparator 31 and a second selector 42 disposed between a plurality of second monitoring transistors Tm_QB1 to Tm_QB4 and a second comparator 32.

The first selector 41 selects the sum of Vm1_Q to Vm4_Q from the first monitoring transistors Tm_Q1 to Tm_Q4 or the most widely varying voltage among these voltages and feeds it to the first comparator 31. The most widely varying voltage is the voltage that shows the largest variation among Vm1_Q to Vm4_Q. The second selector 42 selects the sum of Vm1_QB to Vm4_QB from the second monitoring transistors Tm_QB1 to Tm_QB4 or the most widely varying voltage among these voltages and feeds it to the second comparator 32. To this end, the first and second selectors 41 and 42 each comprise an ADC (analog-to-digital converter) that converts the received monitoring voltages Vm1_Q to Vm4_Q and Vm1_QB to Vm4_QB to digital data, a logic part that adds the data received from the ADC and selects the sum of the data or data for the most widely varying voltage, and a DAC (digital-to-analog converter) that converts the data output from the logic part to an analog voltage Vm. Rset in FIG. 9 may vary depending on the voltage selected by the voltage selector 41.

Figure 13:
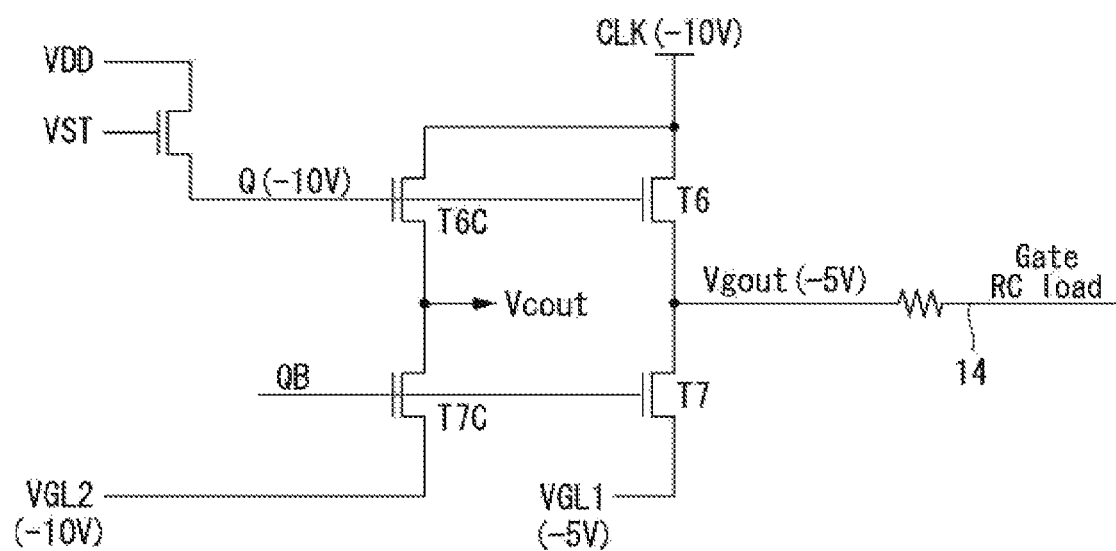
FIG. 13 is a circuit diagram showing NBTS (negative bias temperature stress) in a second section shown in FIG. 11.

FIGS. 11 to 13 are views showing a method of compensating for stress on a transistor by using VGL1 and VGL2. FIG. 11 is a waveform diagram showing an output voltage from a GIP circuit. FIG. 12 is a view showing PBTS in a first section SEC1 shown in FIG. 11. FIG. 13 is a view showing NBTS in a second section SEC2 shown in FIG. 11.

Referring to FIGS. 11 to 13, the waveform of gate pulses output from the GIP circuit 18A and 18B may be divided into a first section SEC1 and a second section SEC2. The first section SEC1 is a section in which each gate pulse rises from VGL2(−10V) to VGH(20V). The second section SEC2 is a section following a gate pulse, in which the voltage of a gate line 14 is held at VGL1.

In 1 frame (with a duration of about 16.67 ms) with a frame rate of 60 Hz, Section 1 is about 62 µs in length, and Section 2 is about 16.6 ms in length.

Section 1 has positive bias stress PBTS because the gate voltage of the transistor T6 is higher than the source voltage as shown in FIG. 12. On the contrary, Section 2 has negative bias stress NBTS because the gate voltage of the transistor T6 is lower than the source voltage as shown in FIG. 13. PBTS (positive bias temperature stress) and NBTS (negative bias temperature stress) are indicators for determining deterioration of a transistor. PBTS and NBTS denote gate bias stress on a transistor which takes a temperature-dependent stress acceleration factor into account.

The present disclosure may reduce the size of the transistor T6 by compensating for the PBTS in Section 1 by the NBTS in Section 2, and therefore reduce the size of the bezel on the display device by that amount.

As described above, the present disclosure may simplify the circuit configuration since two neighboring stages in a GIP circuit share a QB node and a carry signal, and compensate for positive stress on pull-up and pull-down transistors by negative stress by using first and second gate-low voltages of different voltage levels. Furthermore, the present disclosure may reduce the size of pull-up and pull-down transistors connected to Q and QB nodes in the GIP circuit by varying the voltages for charging the Q node and the QB node based on a result of sensing deterioration of the transistors. Consequently, the present disclosure may achieve a narrow bezel on the display device by reducing the size of the GIP circuit.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A gate drive circuit, comprising:
a first stage configured to output a first gate pulse at a first output terminal by increasing a voltage at the first output terminal when a first Q node is charged in response to receiving a first carry signal at a first start terminal, and decreasing the voltage at the first output terminal when a first QB node is charged; and
a second stage configured to output a second gate pulse at a second output terminal and to output a second carry signal at a third output terminal by increasing respective voltages at the second and third output terminals when a second Q node is charged in response to receiving the first carry signal at a second start terminal, and decreasing the voltages at the second and third output terminals when a second QB node is charged,
wherein the first and second start terminals are connected together via a carry sharing node, and the first and second QB nodes are connected together via a QB sharing node,
wherein a voltage waveform on gate lines to which the first and second gate pulses are output includes a first section in which the voltage rises from a second gate-low voltage to a gate-high voltage and a second section in which the voltage is held at a first gate-low voltage, and
wherein the first gate-low voltage is greater than the second gate-low voltage and less than the gate-high voltage.

2. The gate drive circuit of claim 1, further comprising:
a plurality of dummy stages connected as a cascade to the first and second stages, each of the dummy stages including a respective Q node and a respective QB node;
a first monitoring transistor connected to the Q node of at least one of the dummy stages; and
a second monitoring transistor connected to the QB node of at least one of the dummy stages,
wherein a first voltage for charging the first and second Q nodes varies based on a deterioration sensing result from the first monitoring transistor, and a second voltage for charging the first and second QB nodes varies based on a deterioration sensing result from the second monitoring transistor.

3. The gate drive circuit of claim 2, wherein the first stage comprises:
a first pull-up transistor that pulls up the voltage of the first gate pulse by charging the first output terminal in response to the voltage at the first Q node;
a first pull-down transistor that pulls down the voltage of the first gate pulse by discharging the first output terminal down to the first gate-low voltage in response to the voltage at the first QB node;
a first transistor that charges the first Q node with the first voltage in response to the first carry signal;
a second transistor that discharges the first Q node down to the second gate-low voltage in response to a third carry signal;
a third transistor that discharges the first Q node in response to the voltage at the first QB node;
a fourth transistor that charges the first and second QB nodes with the second voltage; and
a fifth transistor that discharges the first and second QB nodes in response to the voltage at the first Q node,
wherein the second carry signal is generated subsequent to the first carry signal and prior to the third carry signal.

4. The gate drive circuit of claim 3, wherein the second stage comprises:
a second pull-up transistor that pulls up the voltage of the second gate pulse by charging the second output terminal in response to the voltage at the second Q node;
a second pull-down transistor that pulls down the voltage of the second gate pulse by discharging the second output terminal down to the first gate-low voltage in response to the voltage at the second QB node;
a third pull-up transistor that pulls up the voltage of the second carry signal by charging the third output terminal in response to the voltage at the second Q node;
a third pull-down transistor that pulls down the voltage of the second carry signal by discharging the third output terminal down to the second gate-low voltage in response to the voltage at the second QB node;
a sixth transistor that charges the second Q node with a VDD1 voltage in response to the first carry signal;

a seventh transistor that brings the voltage at the second Q node down to the second gate-low voltage in response to the third carry signal;
an eighth transistor that discharges the second Q node in response to the voltage at the second QB node; and
a ninth transistor that discharges the second QB node in response to the voltage at the third output terminal.

5. The gate drive circuit of claim 2, further comprising:
a first comparator that senses a change in current through the first monitoring transistor; and
a second comparator that senses a change in current through the second monitoring transistor,
wherein the change in current through the first monitoring transistor is converted into a first monitoring voltage through a resistor and input into a first input terminal of the first comparator, and the change in current through the second monitoring transistor is converted into a second monitoring voltage through the resistor and input into a first input terminal of the second comparator,
wherein a given reference voltage is fed to second input terminals of the first and second comparators, and
wherein the first comparator changes the first voltage by amplifying a difference between the first monitoring voltage and the reference voltage, and the second comparator changes the second voltage by amplifying a difference between the second monitoring voltage and the reference voltage.

6. The gate drive circuit of claim 1 wherein the third output terminal provides the second carry signal to a subsequent third stage and a subsequent fourth stage.

7. A display device, comprising:
a display panel comprising data lines and gate lines; and
a gate drive circuit that outputs gate pulses to the gate lines through an output terminal,
the gate drive circuit comprising:
a first stage configured to output a first gate pulse at a first output terminal by increasing a voltage at the first output terminal when a first Q node is charged in response to receiving a first carry signal at a first start terminal, and decreasing the voltage at the first output terminal when a first QB node is charged; and
a second stage configured to output a second gate pulse at a second output terminal and to output a second carry signal at a third output terminal that is coupled to two next stages by increasing respective voltages at the second and third output terminals when a second Q node is charged in response to receiving the first carry signal at a second start terminal, and decreasing the voltage at the second and third output terminals when a second QB node is charged,
wherein the first and second start terminals are connected together via a carry sharing node, and the first and second QB nodes are connected together via a QB sharing node,
wherein a voltage waveform on gate lines to which the first and second gate pulses are output includes a first section in which the voltage rises from a second gate-low voltage to a gate-high voltage and a second section in which the voltage is held at a first gate-low voltage, and
wherein the first gate-low voltage is greater than the second gate-low voltage and less than the gate-high voltage.

8. The display device of claim 7, further comprising:
a plurality of dummy stages connected as a cascade to the first and second stages;
a first monitoring transistor connected to the Q node of at least one of the dummy stages; and
a second monitoring transistor connected to the QB node of at least one of the dummy stages,
wherein a first voltage for charging the first and second Q nodes varies based on a deterioration sensing result from the first monitoring transistor, and a second voltage for charging the first and second QB nodes varies based on a deterioration sensing result from the second monitoring transistor.

9. The display device of claim 8, wherein the first stage comprises:
a first pull-up transistor that pulls up the voltage of the first gate pulse by charging the first output terminal in response to the voltage at the first Q node;
a first pull-down transistor that pulls down the voltage of the first gate pulse by discharging the first output terminal down to the first gate-low voltage in response to the voltage at the first QB node;
a first transistor that charges the first Q node with the first voltage in response to the first carry signal;
a second transistor that discharges the first Q node down to the second gate-low voltage in response to a third carry signal;
a third transistor that discharges the first Q node in response to the voltage at the first QB node;
a fourth transistor that charges the first and second QB nodes with the second voltage; and
a fifth transistor that discharges the first and second QB nodes in response to the voltage at the first Q node,
wherein the second carry signal is generated subsequent to the first carry signal and prior to the third carry signal.

10. The display device of claim 9, wherein the second stage comprises:
a second pull-up transistor that pulls up the voltage of the second gate pulse by charging the second output terminal in response to the voltage at the second Q node;
a second pull-down transistor that pulls down the voltage of the second gate pulse by discharging the second output terminal down to the first gate-low voltage in response to the voltage at the second QB node;
a third pull-up transistor that pulls up the voltage of the second carry signal by charging the third output terminal in response to the voltage at the second Q node;
a third pull-down transistor that pulls down the voltage of the second carry signal by discharging the third output terminal down to the second gate-low voltage in response to the voltage at the second QB node;
a sixth transistor that charges the second Q node with a VDD1 voltage in response to the first carry signal;
a seventh transistor that brings the voltage at the second Q node down to the second gate-low voltage in response to the third carry signal;
an eighth transistor that discharges the second Q node in response to the voltage at the second QB node; and
a ninth transistor that discharges the second QB node in response to the voltage at the third output terminal.

11. The display device of claim 8, further comprising:
a first comparator that senses a change in current through the first monitoring transistor; and
a second comparator that senses a change in current through the second monitoring transistor,
wherein the change in current through the first monitoring transistor is converted into a first monitoring voltage through a resistor and input into a first input terminal of the first comparator, and the change in current through the second monitoring transistor is converted into a second monitoring voltage through the resistor and input into a first input terminal of the second comparator, wherein a reference voltage is provided to second input terminals of the first and second comparators, and wherein the first comparator changes the first voltage by amplifying a difference between the first monitoring voltage and the reference voltage, and the second comparator changes the second voltage by amplifying a difference between the second monitoring voltage and the reference voltage.

12. The display device of claim 11, wherein a plurality of first monitoring transistors and a plurality of second monitoring transistors are distributed on the display panel.

13. The display device of claim 12, further comprising:
a first selector that outputs the first monitoring voltage to the first comparator by selecting at least one of a sum of first monitoring voltages from the first monitoring transistors or a most widely varying voltage among the first monitoring voltages; and
a second selector that outputs the second monitoring voltage to the second comparator by selecting at least one of a sum of second monitoring voltages from the second monitoring transistors or a most widely varying voltage among the second monitoring voltages.

14. A display device, comprising:
a first gate output stage including:
a first start terminal configured to receive a first carry signal;
a first Q node coupled to a gate terminal of a first pull-up transistor;
a first QB node coupled to a gate terminal of a first pull-down transistor; and
a first output terminal coupled between the first pull-up transistor and the first pull-down transistor, the first output terminal configured to output a first gate pulse to a first gate line; and
a second gate output stage including:
a second start terminal configured to receive the first carry signal, the second start terminal being coupled to the first start terminal of the first gate output stage;
a second Q node coupled to a gate terminal of a second pull-up transistor and to a gate terminal of a third pull-up transistor;
a second QB node coupled to a gate terminal of a second pull-down transistor and to a gate terminal of a third pull-down transistor, the second QB node further coupled to the first QB node of the first gate output stage;
a second output terminal coupled between the second pull-up transistor and the second pull-down transistor, the second output terminal configured to output a second gate pulse to a second gate line; and
a third output terminal coupled between the third pull-up transistor and the third pull-down transistor, the third output terminal configured to output a second carry signal, wherein the second pull-down transistor is coupled between the second output terminal and a first voltage, and the third pull-down transistor is coupled between the third output terminal and a second voltage that is different from the first voltage, and wherein each of the first and second gate pulses include a respective first section in which a voltage of the gate pulse rises from the second voltage to a third voltage, and a respective second section in which the voltage of the gate pulse is held at the first voltage, wherein the first voltage is between the second voltage and the third voltage.

15. The display device of claim 14, further comprising:
a third gate output stage including a third start terminal configured to receive the second carry signal, and a fourth output terminal configured to output a third gate pulse to a third gate line; and
a fourth gate output stage including a fourth start terminal coupled to the third start terminal and configured to receive the second carry signal, a fifth output terminal configured to output a fourth gate pulse to a fourth gate line, and a sixth output terminal configured to output a third carry signal.

16. The display device of claim 14, further comprising:
a dummy stage coupled to the first and second gate output stages, the dummy stage including a respective Q node and a respective QB node;
a first monitoring transistor having a gate terminal coupled to the Q node of the dummy stage and configured to output a first deterioration sensing signal; and
a second monitoring transistor having a gate terminal coupled to the QB node of the dummy stage, and configured to output a second deterioration sensing signal,
wherein a third voltage for charging the first and second Q nodes varies based on the first deterioration sensing signal, and a fourth voltage for charging the first and second QB nodes varies based on the second deterioration sensing signal.

17. The display device of claim 16, further comprising:
a first comparator having a first input coupled to the output of the first monitoring transistor, a second input coupled to a reference voltage, and an output that outputs the third voltage; and
a second comparator having a first input coupled to the output of the second monitoring transistor, a second input coupled to the reference voltage, and an output that outputs the fourth voltage.

18. The display device of claim 17, further comprising:
a display panel including a bezel area; and
a printed circuit board adjacent to the display panel,
wherein the first and second gate output stages, the dummy stage, and the first and second monitoring transistors are disposed on the bezel area, and wherein the first and second comparators are disposed on the printed circuit board.

19. The display device of claim 14 wherein the second voltage is lower than the first voltage.

* * * * *